(12) United States Patent
Waldschmidt

(10) Patent No.: US 7,248,056 B2
(45) Date of Patent: Jul. 24, 2007

(54) THREE-PHASE ELECTRICAL RECEPTACLE TESTER

(76) Inventor: Joseph Waldschmidt, 381 71st St., South Haven, MI (US) 49090

( * ) Notice: Subject to any disclaimer, the term of this patent is extended or adjusted under 35 U.S.C. 154(b) by 234 days.

(21) Appl. No.: 11/049,470

(22) Filed: Feb. 2, 2005

(65) Prior Publication Data
US 2005/0176286 A1 Aug. 11, 2005

Related U.S. Application Data

(60) Provisional application No. 60/542,598, filed on Feb. 6, 2004.

(51) Int. Cl.
*G01R 31/00* (2006.01)
*G01R 19/14* (2006.01)
(52) U.S. Cl. ........... 324/508; 324/133
(58) Field of Classification Search ......... 324/508, 324/133
See application file for complete search history.

(56) References Cited

U.S. PATENT DOCUMENTS

| 2,449,150 | A |   | 9/1948  | Schnoll |
|-----------|---|---|---------|---------|
| 2,598,775 | A |   | 6/1952  | Fischer |
| 3,317,825 | A |   | 5/1967  | Huff |
| 3,383,588 | A |   | 5/1968  | Stoll et al. |
| 3,579,100 | A |   | 5/1971  | Lauver |
| 3,783,371 | A |   | 1/1974  | McMillan |
| 3,836,843 | A |   | 9/1974  | Yonce |
| 3,836,844 | A |   | 9/1974  | Prugh |
| 3,904,958 | A |   | 9/1975  | Gartland, Jr. et al. |
| 3,922,600 | A |   | 11/1975 | Roveti |
| 3,967,195 | A |   | 6/1976  | Averitt et al. |
| 3,984,765 | A |   | 10/1976 | Rocci, Jr. |
| 4,015,201 | A |   | 3/1977  | Chaffee |
| 4,791,376 | A |   | 12/1988 | Freedman et al. |
| 4,885,532 | A | * | 12/1989 | Macey ................ 324/133 |
| 5,065,104 | A | * | 11/1991 | Kusko et al. ........... 324/508 |
| 5,192,231 | A | * | 3/1993  | Dolin, Jr. ............ 439/620.21 |
| 6,054,849 | A |   | 4/2000  | Collier et al. |
| 7,068,038 | B2 | * | 6/2006 | Mason et al. ........... 324/508 |

* cited by examiner

*Primary Examiner*—Walter Benson
*Assistant Examiner*—Amy He
(74) *Attorney, Agent, or Firm*—Watson IP Group, PLC; Jovan N. Jovanovic; Vladan M. Vasijevic

(57) ABSTRACT

A three phase receptacle tester including a housing, an electrical connection and a coupling assembly. The housing includes an outer surface, an opening and an inner cavity, wherein the opening provides access to the inner cavity. The electrical connection assembly having a body, condition indicators and a coupling assembly. The body having an outward surface, an inward surface and a periphery. The periphery of the body matingly engaging the opening of the housing, so as to preclude access to the inner cavity. One prong extends from the outward surface of the body for each phase and one prong extends from the outward surface of the body corresponding to a ground/common. Each of the prongs spaced radially outward from a central axis. Each of the phase prongs electrically connected with the ground/common prong and the condition indicator positioned therebetween. The condition indicator identifies at least one of current flow between a respective phase prong and the ground/common prong. The coupling assembly couples the electrical connection assembly to the housing.

15 Claims, 4 Drawing Sheets

THREE-PHASE ELECTRICAL RECEPTACLE TESTER

CROSS-REFERENCE TO RELATED APPLICATION

This application claims the priority of U.S. Provisional Patent Application Ser. No. 60/542,598 filed Feb. 6, 2004, the entire specification of which is incorporated herein by reference.

BACKGROUND OF THE INVENTION

1. Field of the Invention

The present invention relates in general to a testing device, and more particularly to an electrical receptacle tester for testing three-phase electrical receptacles. Such receptacles comprise a total of 480V over three separate phases that are shifted relative to each other.

2. Background Art

The use of testing equipment to determine the condition of different electrical receptacles is known in the art. Among other uncovered patents, we have uncovered U.S. Pat. No. 2,449,150 issued to Schnoll; U.S. Pat. No. 2,598,775 issued to Fischer; U.S. Pat. No. 3,317,825 issued to Huff; U.S. Pat. No. 3,579,100 issued to Lauver; U.S. Pat. No. 3,383,588 issued to Stoll et al; U.S. Pat. No. 3,783,371 issued to McMillan; U.S. Pat. No. 3,836,843 issued to Yonce; U.S. Pat. No. 3,836,844 issued to Prugh; U.S. Pat. No. 3,904,958 issued to Gartland, Jr et al; U.S. Pat. No. 3,922,600 issued to Roveti; U.S. Pat. No. 3,967,195 issued to Averitt et al; U.S. Pat. No. 3,984,765 issued to Rocci, Jr; U.S. Pat. No. 4,015,201 issued to Chaffee; U.S. Pat. No. 4,791,376 issued to Freedman et al; and U.S. Pat. No. 6,054,849 issued to Collier et al. While the foregoing references discuss the use of various testing equipment, such testers are generally configured for use in association with single phase current, such as household standard 110 v receptacles.

With higher voltages, and in particular voltages of multiple phase, typically, separate wires having alligator clips attached thereto are individually clipped to the various components. Such products are offered by Ideal, Fluke and Extech Instruments. Among other drawbacks, there are safety concerns associated with the individual application of leads to various regions. Furthermore, the use of the clips further lead to operator error.

Thus, it is an object of the invention to provide for a receptacle tester which is capable of testing three phase receptacles.

It is another object of the invention to provide for a receptacle tester wherein the leads of the various phases are coupled simultaneously so as to limit inadvertent problems that may arise through incorrect coupling.

These and other objects of the present invention will become apparent in light of the present specification, claims, and drawings.

SUMMARY OF THE INVENTION

The invention is directed to a three phase receptacle tester. The three phase receptacle tester comprises a housing, an electrical connection and a coupling assembly. The housing includes an outer surface, an opening and an inner cavity, wherein the opening provides access to the inner cavity. The electrical connection assembly having a body, condition indicators and a coupling assembly. The body having an outward surface, an inward surface and a periphery. The periphery of the body matingly engaging the opening of the housing, so as to preclude access to the inner cavity. One prong extends from the outward surface of the body for each phase and one prong extends from the outward surface of the body corresponding to a ground/common. Each of the prongs spaced radially outward from a central axis. Each of the phase prongs electrically connected with the ground/common prong and the condition indicator positioned therebetween. The condition indicator identifies at least one of current flow between a respective phase prong and the ground/common prong. The coupling assembly couples the electrical connection assembly to the housing.

In a preferred embodiment, the outer surface of the housing includes an interfacing region. The interfacing region permits insertion within a receptacle and rotation of the housing about the central axis.

In another preferred embodiment, the condition indicators extend through the housing to the outer surface thereof. In one such embodiment, the condition indicators extend through the housing on a surface which is opposite of the opening and substantially perpendicular to the outward surface of the body of the electrical connection assembly.

In another preferred embodiment, the condition indicators comprise at least one of the group consisting of: lamps, LED's, digital displays and analog displays.

Preferably, the coupling assembly comprises a plurality of fasteners that extend into the body from the outward surface thereof and which are coupled to the housing within the cavity.

In yet another preferred embodiment, the outer surface of the housing includes a grasping region. The grasping region comprises a plurality of walls which together form a generally rectangular peripheral surface.

In another preferred embodiment, at least one of the common/ground prong and the phase prongs include a key structure which precludes inadvertent removal of the respective prongs from the receptacle.

BRIEF DESCRIPTION OF THE DRAWINGS

The invention will now be described with reference to the drawings wherein.

DETAILED DESCRIPTION OF THE INVENTION

Figure 1:
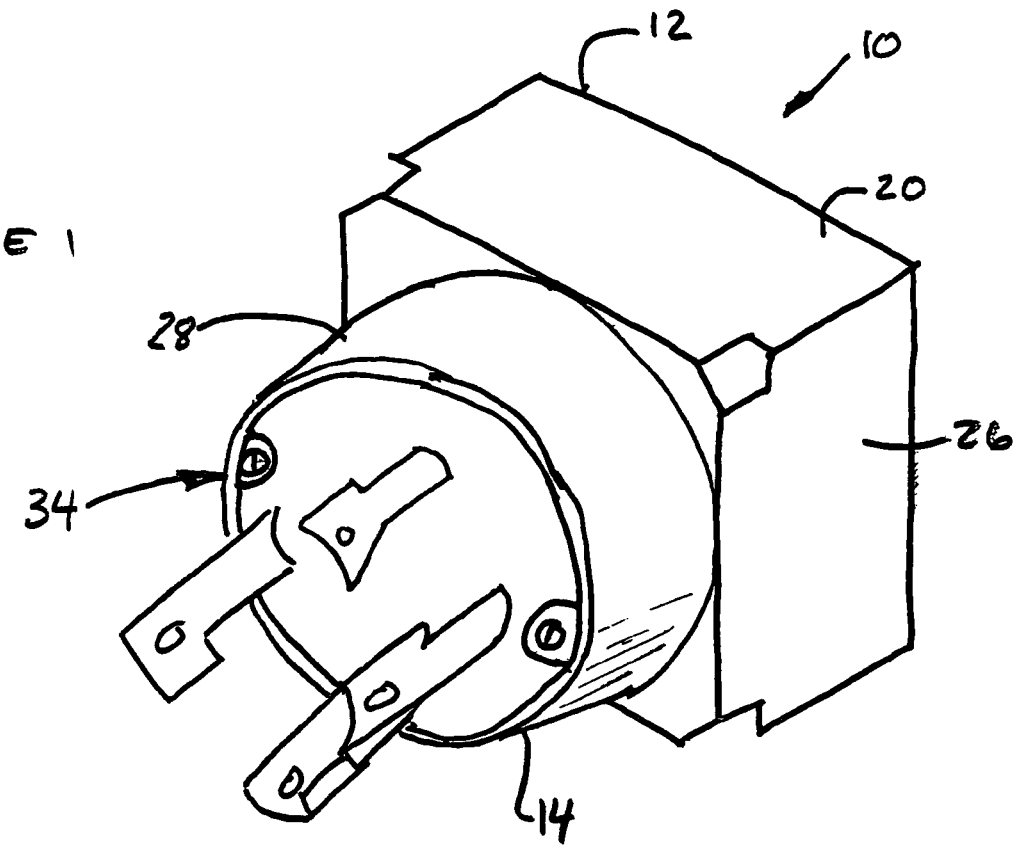
FIG. 1 of the drawings comprises a perspective view of the three phase receptacle tester of the present invention.

While this invention is susceptible of embodiment in many different forms, there is shown in the drawings and described herein in detail several specific embodiments with the understanding that the present disclosure is to be considered as an exemplification of the principles of the invention and is not intended to limit the invention to the embodiments illustrated.

It will be understood that like or analogous elements and/or components, referred to herein, may be identified throughout the drawings by like reference characters. In addition, it will be understood that the drawings are merely schematic representations of the invention, and some of the components may have been distorted from actual scale for purposes of pictorial clarity.

Referring now to the drawings and in particular to FIG. 1, three phase receptacle tester 10 is shown in FIG. 1. The receptacle tester includes housing 12 and electrical connection assembly 14. The receptacle tester is configured for the testing of three phase electrical receptacles which commonly include three "hot" wires and one ground/common wire. Such receptacles can commonly be found at industrial locations.

Figure 5:
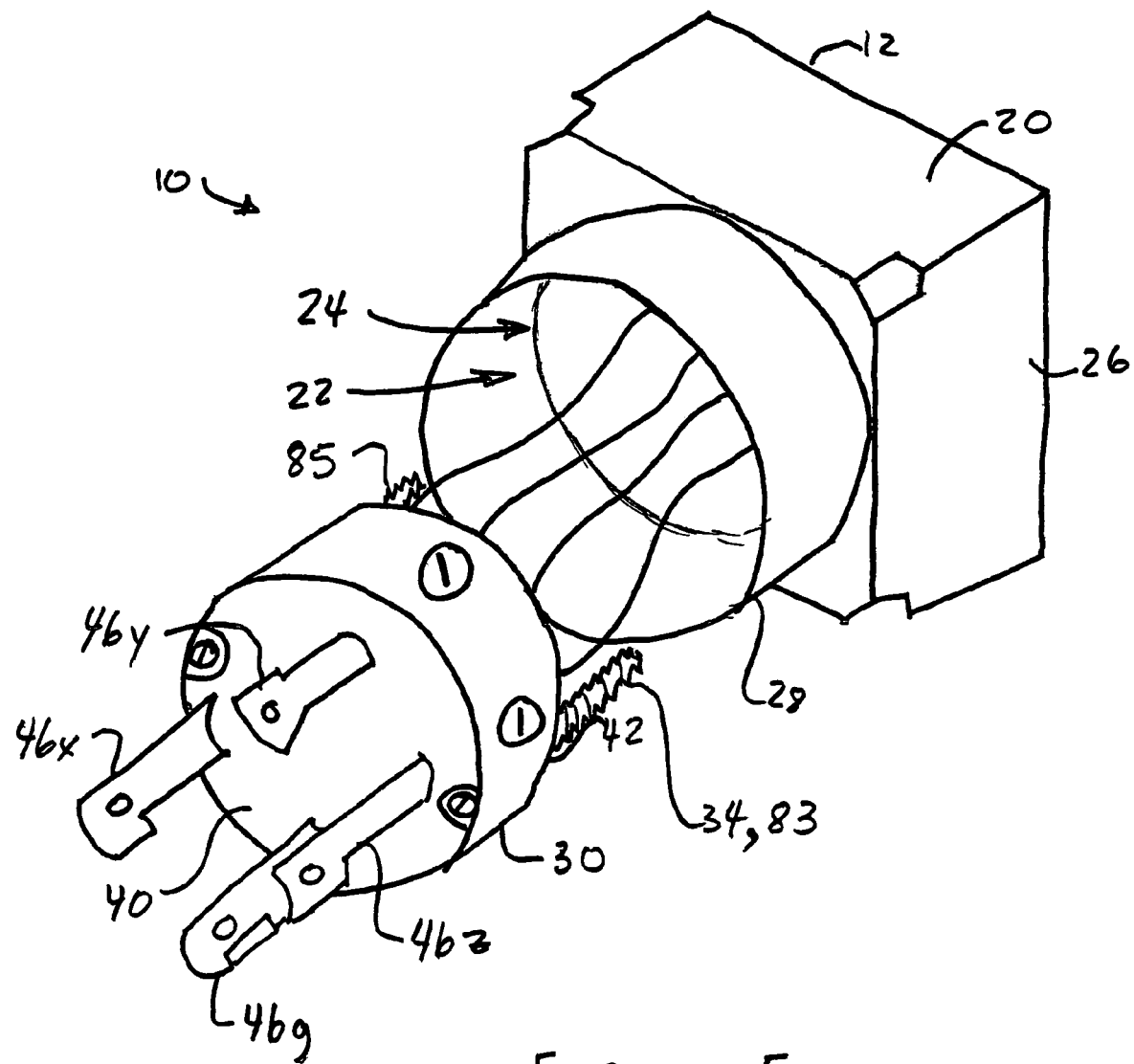
FIG. 5 of the drawings comprises an exploded perspective view of the three phase receptacle tester of the present invention.
Figure 6:
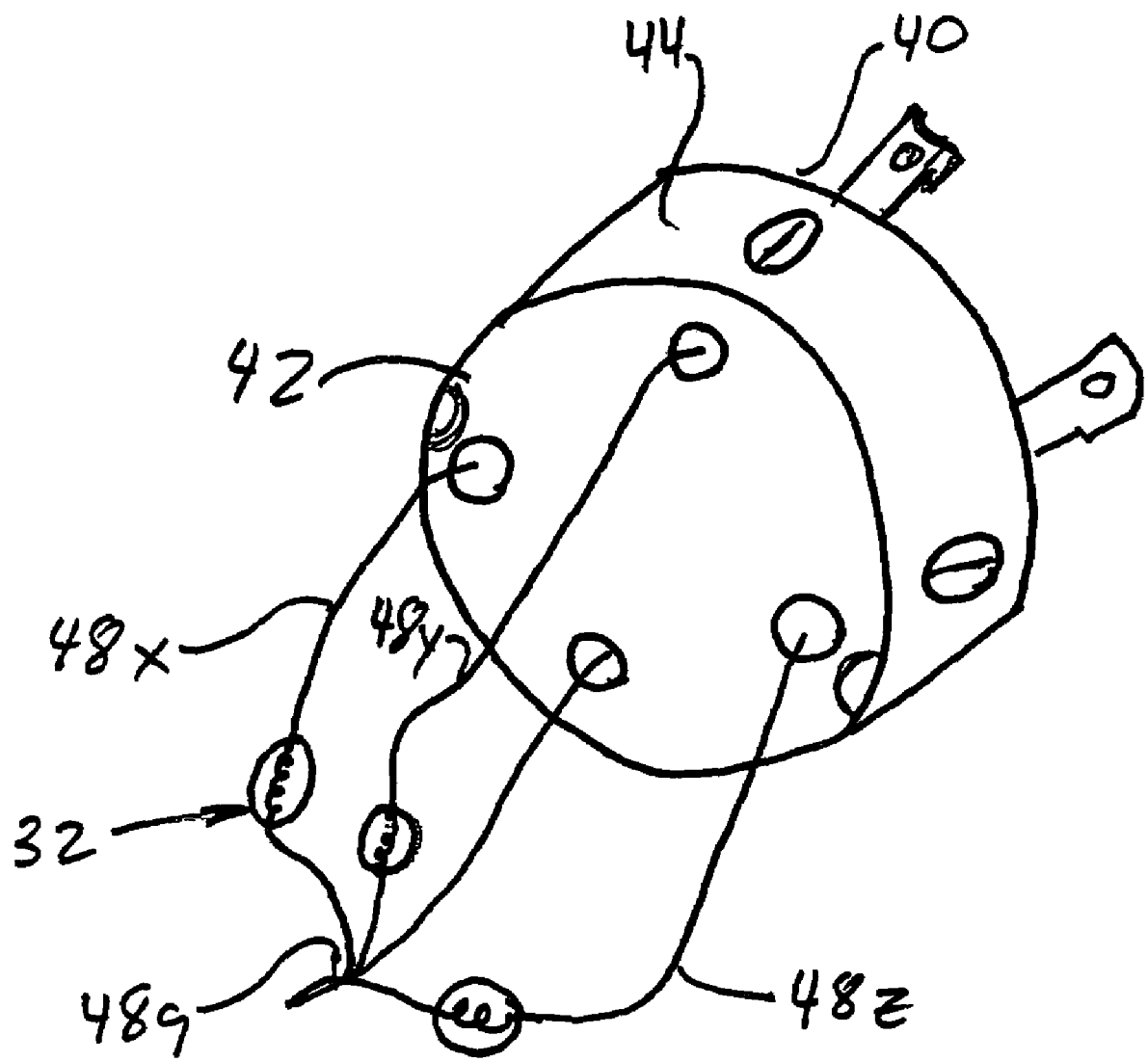
FIG. 6 of the drawings comprises a perspective view of the electrical connection assembly of the three phase receptacle tester of the present invention.

Housing 12 is shown in FIG. 5 as comprising outer surface 20, opening 22 and inner cavity 24. The housing preferably comprises a single molded or machined member wherein the cavity is generally of an insulative material. Of course, it is contemplated that a housing may be formed from a plurality of separate components which are releasably or permanently attached together through welding, adhering, fastening, etc. In the particular embodiment contemplated, the housing comprises a polymer material, a natural rubber material and/or a synthetic rubber material. Of course, the invention is not limited to any particular type of housing material.

As is shown in FIGS. 1 and 5, the outer surface includes two regions, grasping region 26 and interfacing region 28. The grasping region 26 is shown as comprising a substantially cubic configuration which includes four side walls by which the device may be grasped. Of course, other shapes are contemplated for use which provide adequate ability to grasp an object. Additionally, the configuration should facilitate the rotation of the housing as well, the significance of which will be explained below. In other embodiments, gripping surfaces may be provided to facilitate the grasping of the object.

The interfacing region 28 of the outer surface 20 includes a substantially cylindrical configuration which is adapted to cooperatively interact with a receptacle. The configuration of the interfacing region permits rotation of the housing about a centrally located longitudinal axis.

Opening 22 provides ingress into inner cavity 24. In the embodiment shown, the opening 22 comprises a substantially circular opening, substantially corresponding in size to the interfacing region. Of course, in other embodiments, other openings are contemplated for use.

Figure 3:
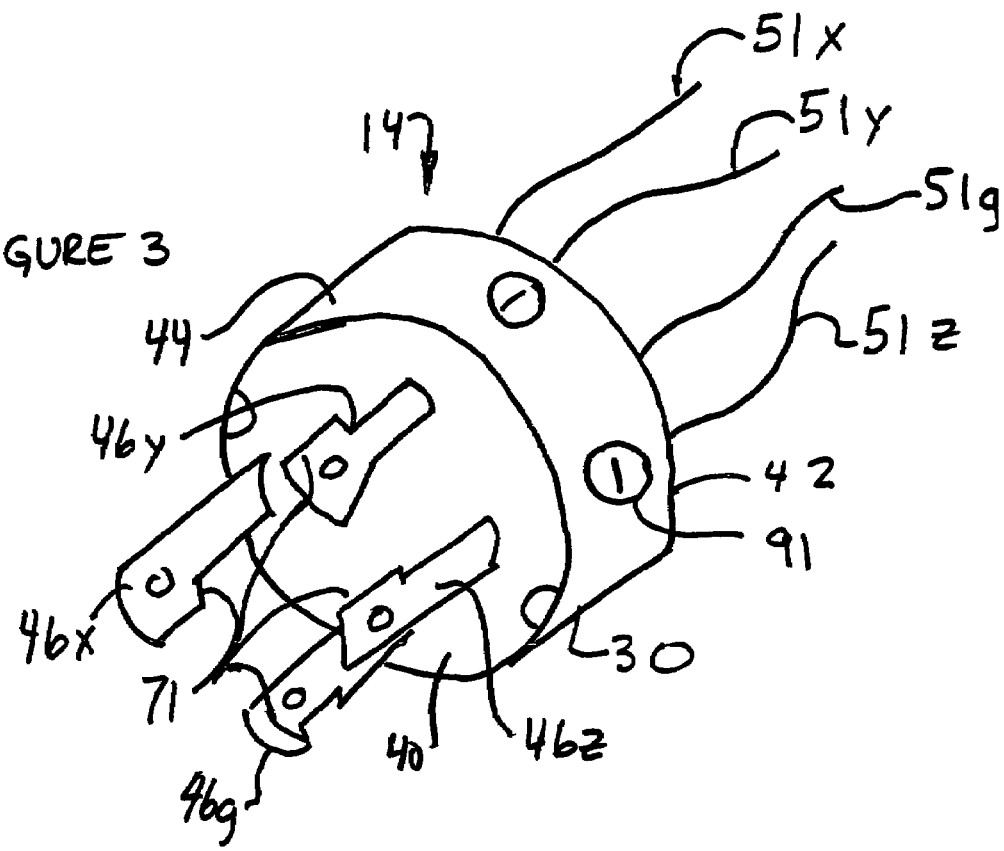
FIG. 3 of the drawings comprises a perspective view of the electrical connection assembly of the three phase receptacle tester of the present invention.

Electrical connection assembly 14 is shown in FIGS. 3, 5 and/or 6 as comprising body 30, condition indicators 32 and coupling assembly 34. Body 30 comprises a substantially cylindrical configuration which substantially dimensionally matches opening 22. Body 30 includes outward surface 40, inward surface 42 and periphery 44. Receptacle interfacing prongs 46x, 46y, 46z and 46g extend outwardly from outward surface 40. The prongs are curved substantially about the central rotational axis of the housing. Additionally, keyed structures, such as structures 71 (FIG. 3) are provided on selective prongs so as to further attach and retain the prongs within the receptacle.

The inward surface includes a plurality of prong attachment structures, namely, prong attachment structures 48x, 48y, 48z and 48g. The prong attachment structures are configured so as to facilitate the attachment of a lead to a respective prong 46x, 46y, 46z and 46g. In the embodiment shown, a plurality of screws such as screw 91 are provided which extend through periphery 44. The plurality of screws are coupled to respective clamp components (not shown) which cooperate with a respective prong to clamp a wire therebetween.

Figure 4:
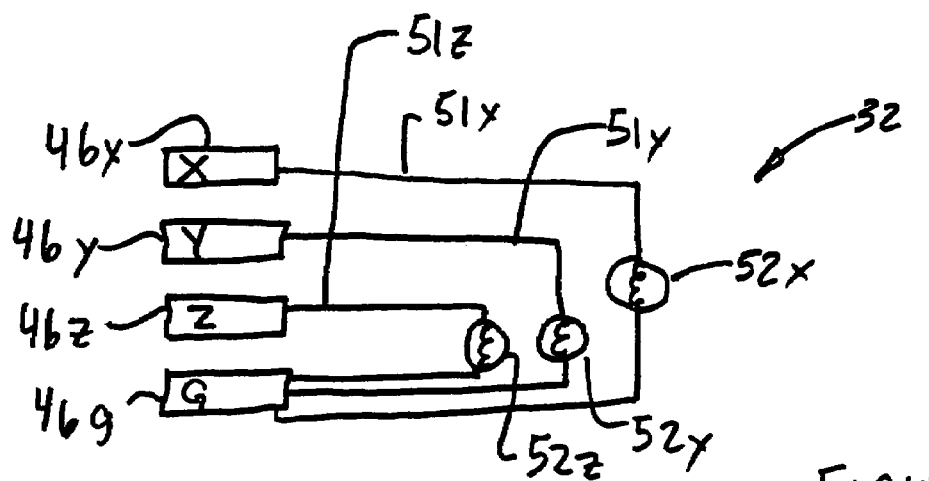
FIG. 4 of the drawings comprises a schematic representation of the three phase receptacle tester of the present invention.

Condition indicators 32 are shown in FIG. 4 as comprising respective circuits 51x, 51y and 51z. Each circuit couples places a respective prong in electrical communication with prong 46g, and positions indicator devices 52x, 52y and 52z, therebetween. The indicator device may comprise a lamp, a LED, a digital readout, an analog readout, etc. Each of such indicator devices provide a means by which to determine if a circuit is completed between one of the prongs and the ground/common. In certain embodiments, to control voltage across the indicators, it may be necessary to provide resistors or other devices to the electrical circuit.

Figure 2:
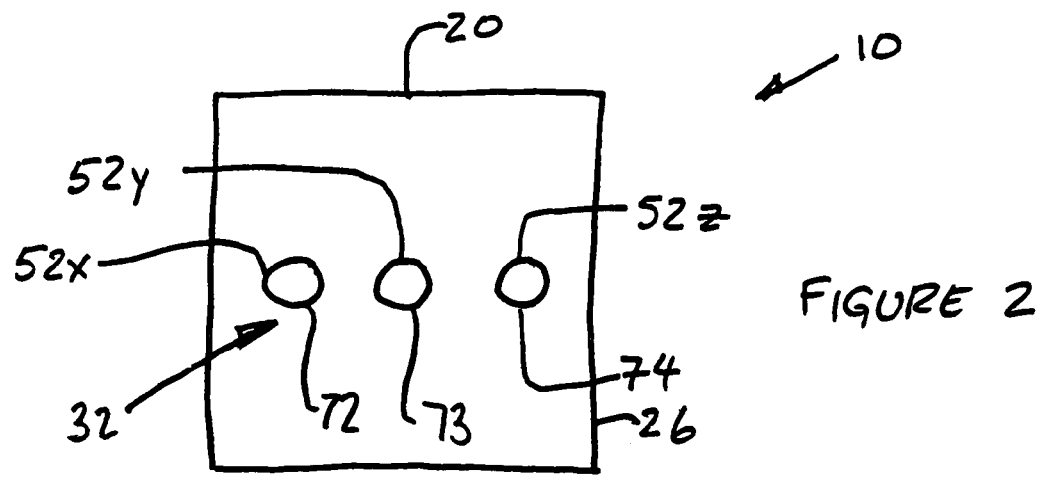
FIG. 2 of the drawings comprises a front view of the three phase receptacle tester of the present invention, showing, in particular, the condition indicator lamps.

With respect to the embodiment shown, circuit 51x couples prong 46x with indicator 51x and common 46g. Circuit 51y couples prong 46y with indicator 51y and common 46g. Circuit 51z couples prong 46z with indicator 51z and common 46z. As is shown in FIG. 2, the indicators are positioned so as to extend through openings 72, 73 and 74 of housing 12, on a side of the housing that opposes opening 22 of the body of the electrical connection assembly 14. Advantageously, as soon as the device is coupled to the indicator, the user can read the output on the front of the housing.

In addition to the foregoing, it is contemplated that other sensors may be positioned within inner cavity 24 so as to provide additional utility. For example, a phase continuity device may be provided, as may other voltage reading devices.

Finally, the electrical connection assembly is inserted into inner cavity 24 of the housing and attached thereto by coupling assembly 34. In particular, threaded fasteners 83, 85 extend through respective opening of body 30 of electrical connection assembly 14 and attached to housing 12. Advantageously, access to the threaded fasteners 83, 85 is provided from outward surface 40 such that when the device is in use, access to the fasteners is substantially precluded.

In operation, prongs 46x, 46y, 46z and 46g are inserted into a three phase receptacle. Once inserted, the body is rotated to insure secured attachment of the receptacle tester to the receptacle. At that time, each of circuits 51x, 51y and 51z become energized, and each indicator device should become activated. In the event that one of the prongs is not energized, then the respective indicator will not become activated. As such, the user can determine which, if any, of the phases coming into the receptacle are not properly energized. Most commonly, the lack of activation of an indicator will be indicative that a fuse has blown in the respective phase.

The foregoing description merely explains and illustrates the invention and the invention is not limited thereto except insofar as the appended claims are so limited, as those skilled in the art who have the disclosure before them will be able to make modifications without departing from the scope of the invention.

What is claimed is:

1. A three phase receptacle tester comprising:
    a housing having an outer surface, an opening and an inner cavity, wherein the opening provides access to the inner cavity;
    an electrical connection assembly having a body, condition indicators and a coupling assembly, the body having an outward surface, an inward surface and a periphery, the periphery of the body matingly engaging the opening of the housing, so as to preclude access to the inner cavity, one prong extending from the outward surface of the body for each phase and one prong extending from the outward surface of the body corresponding to a ground/common, each of the prongs spaced radially outward from a central axis, each of the phase prongs electrically connected with the ground/common prong and the condition indicator positioned therebetween, the condition indicator identifying at least one of current flow between a respective phase prong and the ground/common prong; and a coupling assembly for coupling the electrical connection assembly to the housing.

2. The three phase receptacle tester of claim 1 wherein the outer surface of the housing includes an interfacing region, the interfacing region and the each of the prongs structurally configured for facilitating insertion within a receptacle and rotation of the housing about the central axis.

3. The three phase receptacle tester of claim 1 wherein the condition indicators extend through the housing to the outer surface thereof.

4. The three phase receptacle tester of claim 3 wherein the condition indicators extend through the housing on a surface which is opposite of the opening and substantially perpendicular to the outward surface of the body of the electrical connection assembly.

5. The three phase receptacle tester of claim 1 wherein the condition indicators comprise at least one of the group consisting of: lamps, LED's, digital displays and analog displays.

6. The three phase receptacle tester of claim 1 wherein the coupling assembly comprises a plurality of fasteners that extend into the body from the outward surface thereof and which are coupled to the housing within the cavity.

7. The three phase receptacle tester of claim 1 wherein the outer surface of the housing includes a grasping region. The grasping region comprising a plurality of walls which together form a generally rectangular peripheral surface.

8. The three phase receptacle tester of claim 1 wherein at least one of the common/ground prong and the phase prongs include a key structure which precludes inadvertent removal of the respective prongs from the receptacle, upon insertion and rotation thereof about the central axis.

9. The three phase receptacle tester of claim 1 wherein each of the prongs is curved about the central axis.

10. A three phase receptacle tester comprising:
a housing having an outer surface, an opening and an inner cavity, wherein the opening provides access to the inner cavity, the outer surface of the housing includes an interfacing region, the interfacing region permitting insertion within a receptacle and rotation of the housing about the central axis;

an electrical connection assembly having a body, condition indicators and a coupling assembly, the body having an outward surface, an inward surface and a periphery, the periphery of the body matingly engaging the opening of the housing, so as to preclude access to the inner cavity, one prong extending from the outward surface of the body for each phase and one prong extending from the outward surface of the body corresponding to a ground/common, each of the prongs spaced radially outward from a central axis, each of the phase prongs electrically connected with the ground/common prong and the condition indicator positioned therebetween, the condition indicator identifying at least one of current flow between a respective phase prong and the ground/common prong, at least one of the common/ground prong and the phase prongs include a key structure which precludes inadvertent removal of the respective prongs from the receptacle; and a coupling assembly for coupling the electrical connection assembly to the housing, the coupling assembly comprises a plurality of fasteners that extend into the body from the outward surface thereof and which are coupled to the housing within the cavity.

11. The three phase receptacle tester of claim 10 wherein the condition indicators extend through the housing to the outer surface thereof.

12. The three phase receptacle tester of claim 11 wherein the condition indicators extend through the housing on a surface which is opposite of the opening and substantially perpendicular to the outward surface of the body of the electrical connection assembly.

13. The three phase receptacle tester of claim 10 wherein the condition indicators comprise at least one of the group consisting of: lamps, LED's, digital displays and analog displays.

14. The three phase receptacle tester of claim 10 wherein the outer surface of the housing includes a grasping region. The grasping region comprising a plurality of walls which together form a generally rectangular peripheral surface.

15. The three phase receptacle tester of claim 10 wherein each of the prongs is curved about the central axis.

* * * * *